(12) United States Patent
Krivokapic

(10) Patent No.: US 6,917,068 B1
(45) Date of Patent: Jul. 12, 2005

(54) SEMICONDUCTOR DEVICE HAVING CONDUCTIVE STRUCTURES FORMED NEAR A GATE ELECTRODE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/454,517

(22) Filed: Jun. 5, 2003

Related U.S. Application Data

(63) Continuation-in-part of application No. 10/211,317, filed on Aug. 5, 2002.
(60) Provisional application No. 60/390,116, filed on Jun. 21, 2002.

(51) Int. Cl.[7] ............................................. H01L 29/76
(52) U.S. Cl. ........................................................ 257/314
(58) Field of Search ................................. 257/314–326

(56) References Cited

U.S. PATENT DOCUMENTS

| 5,789,269 A | * | 8/1998 | Mehta et al. ............... 438/439 |
| 5,952,692 A | | 9/1999 | Nakazato et al. |
| 6,121,654 A | | 9/2000 | Likharev |
| 6,703,298 B2 | * | 3/2004 | Roizin et al. ............... 438/593 |

OTHER PUBLICATIONS

The American Heritage Dictionary, 2000.*

Peter Van Zant, Microchip Fabrication, McGraw–Hill, Fourth Edition, p. 529.*

Zoran Krivokapic, U.S. Appl. No. 10/211,317 for "Non-Volatile Memory Device" filed Aug. 5, 2002.

* cited by examiner

*Primary Examiner*—Amir Zarabian
*Assistant Examiner*—Monica Lewis
(74) *Attorney, Agent, or Firm*—Harrity&Snyder, LLP

(57) ABSTRACT

A semiconductor device is provided by forming a gate electrode and a dielectric layer below and adjacent the side surfaces of the gate electrode. Relatively thin conductive structures are formed within the dielectric layer. The conductive structures may be used as a floating gate electrode for a memory device. The conductive structures may also be used to control a threshold voltage for a logic device.

14 Claims, 19 Drawing Sheets

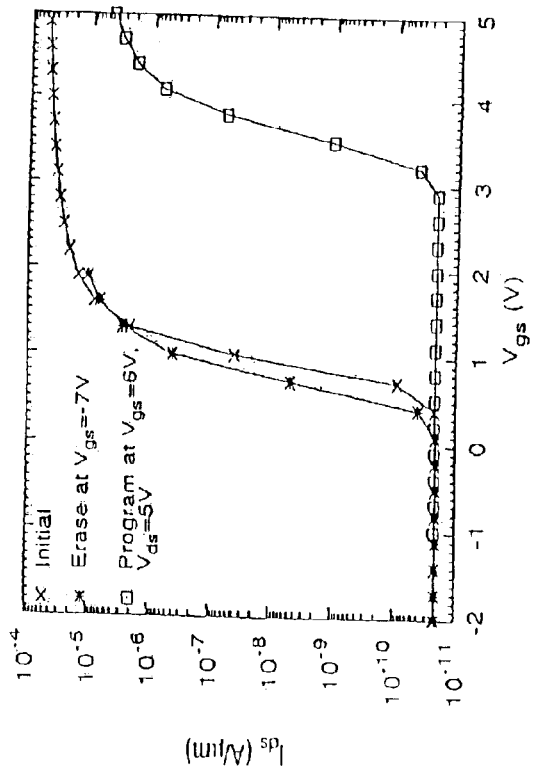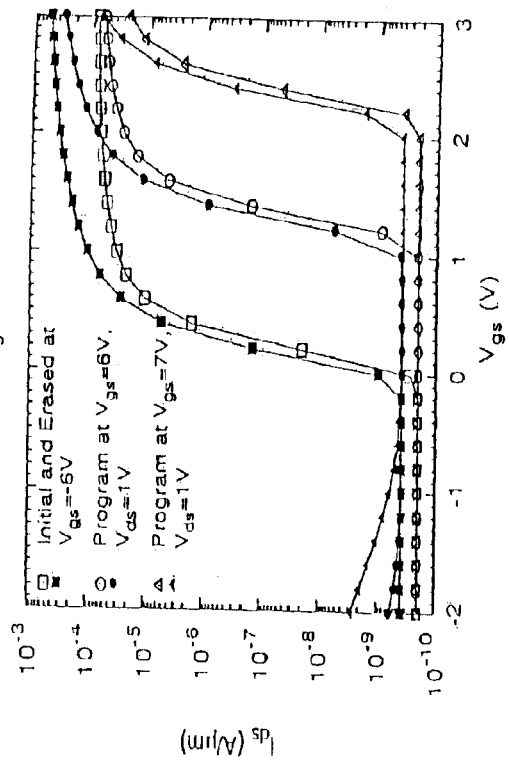

| GOX (nm) | BOX (NM) | TOX (NM) | Tprog | PROG. (v) | Terase | ERASE (v) |
|---|---|---|---|---|---|---|
| 15 | 1.62 | 1.8 | 11μs | 12 | 14μs | -10 |
| 15 | 2.05 | 2.3 | 12ms | 12 | 6ms | -10 |
| 15 | 2.7 | 3.3 | .05s | 12 | 0.4s | -10 |
| 10 | 1.62 | 1.8 | 70ns | 9 | 700ns | -8 |
| 10 | 2.05 | 2.3 | 2.3μs | 9 | 4μs | -8 |
| 5 | 2.7 | 3.3 | 550μs | 7 | 800us | -6 |
| 5 | 5 | 6.1 | 1.2μs | 7 | 1.8μs | -6 |

FIG. 18

SEMICONDUCTOR DEVICE HAVING CONDUCTIVE STRUCTURES FORMED NEAR A GATE ELECTRODE

RELATED APPLICATIONS

This application is a continuation-in-part of U.S. patent application Ser. No. 10/211,317, entitled Non-volatile Memory Device, filed Aug. 5, 2002, the disclosure of which is incorporated herein by reference, and which claims priority under 35 U.S.C. § 119 based on U.S. Provisional Application No. 60/390,116, filed Jun. 21, 2002. This application claims priority under 35 U.S.C. § 119 based on U.S. Provisional Application No. 60/390,116, the disclosure of which is also incorporated herein by reference.

TECHNICAL FIELD

The present invention relates generally to semiconductor devices and methods of manufacturing semiconductor devices. The present invention has particular applicability to memory devices and logic devices.

BACKGROUND ART

Non-volatile memory devices that use a small number of electrons to store data have been recently demonstrated. Such devices, however, have considerable drawbacks associated with their practical application. For example, single-electron memory devices require low operating temperatures and silicon nanocrystal-based memory devices exhibit poor data retention.

DISCLOSURE OF THE INTENTION

Implementations consistent with the present invention provide a semiconductor device that includes conductive structures located near the gate electrode. The conductive structures may be used as a storage element for a memory device. The resulting memory device is able to achieve good charge retention at room temperature. The conductive structures may also be used to program a threshold voltage for a logic transistor.

Additional advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a semiconductor device that includes a semiconductor substrate, a gate electrode, a dielectric layer and at least one silicon structure. The semiconductor substrate includes a channel region, a source region and a drain region and the gate electrode has an upper surface and side surfaces. The dielectric layer is formed adjacent the side surfaces of the gate electrode and extends over the source region and drain region. The at least one silicon structure is formed within a portion of the dielectric layer and located near a lower portion of the gate electrode.

According to another aspect of the invention, a method of manufacturing a semiconductor device includes forming a dielectric layer on a semiconductor substrate and forming a gate electrode on the dielectric layer, where the gate electrode has an upper surface and side surfaces. The method also includes oxidizing a portion of the gate electrode and the semiconductor substrate and depositing a conductive layer over the gate electrode and the semiconductor substrate. The method further includes oxidizing the conductive layer, where a portion of the conductive layer located near a lower portion of the gate electrode is not oxidized.

According to a further aspect of the invention, a non-volatile memory device is provided. The non-volatile memory device includes a semiconductor substrate, a control gate electrode, a dielectric layer and at least one silicon structure. The substrate includes a channel region, a source region and a drain region and the control gate electrode has an upper surface and side surfaces. The dielectric layer is formed on an upper surface of the semiconductor substrate and adjacent the side surfaces of the control gate electrode. The at least one silicon structure is formed within the dielectric layer near a lower portion of the control gate electrode and functions as a charge storage structure for the non-volatile memory device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 16 illustrates slope degradation during hot carrier programming for an exemplary semiconductor device consistent with the present invention.

FIG. 17 illustrates tunneling programming for an exemplary semiconductor device consistent with the present invention.

FIG. 18 illustrates programming and erasing times under a number of conditions for semiconductor devices consistent with the present invention.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide semiconductor devices and methods of manufacturing such devices. A semiconductor device formed in accordance with the present invention includes conductive structures formed near a gate of the semiconductor device. The conductive structures may be used as a floating gate electrode for a memory device. The resulting memory device may be scaled to small design features while maintaining good charge retention. The conductive structures may also be used in a logic device to control threshold voltage.

Figure 1:
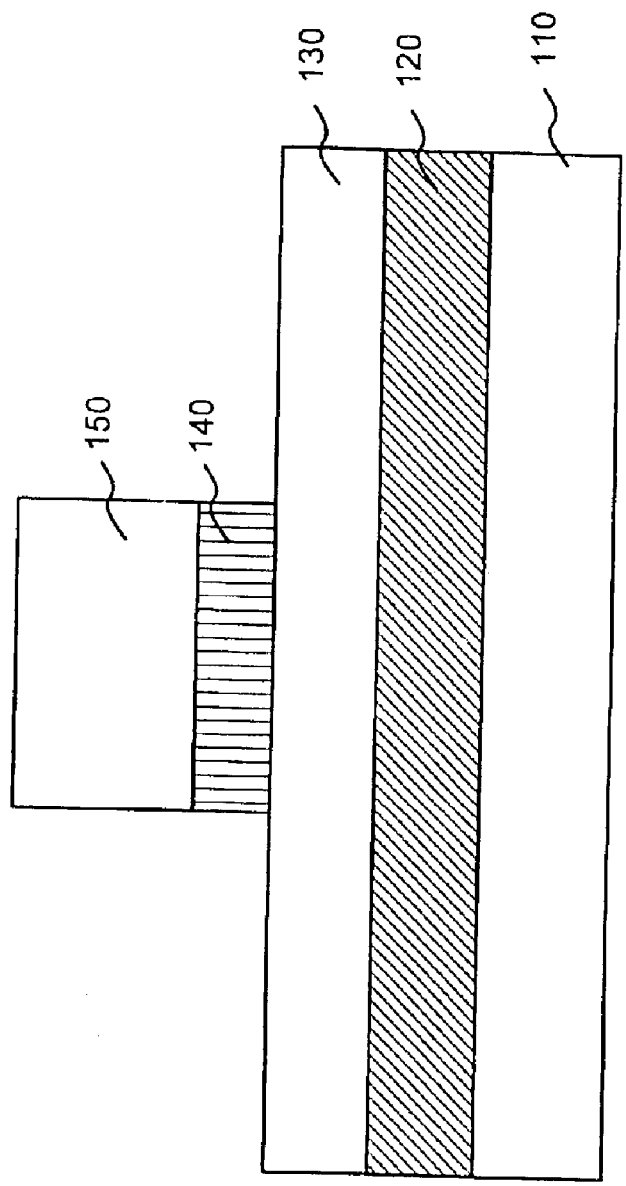
FIGS. 1–6 illustrate the cross-section of a semiconductor device formed in accordance with an exemplary implementation of the present invention.

FIG. 1 illustrates the cross-section of a semiconductor device 100 formed in accordance with an exemplary implementation of the present invention. Referring to FIG. 1, semiconductor device 100 may include a silicon on insulator (SOI) structure that includes a silicon substrate 110, a buried oxide layer 120 and a silicon layer 130 on the buried oxide layer 120. Buried oxide layer 120 and silicon layer 130 may be formed on substrate 110 in a conventional manner.

Substrate 110, consistent with the present invention, may comprise crystalline silicon. In an exemplary implementation, buried oxide layer 120 may include a silicon oxide and may have a thickness ranging from about 1000 Å to about 4000 Å. Silicon layer 130 may include monocrystalline or polycrystalline silicon having a thickness ranging from about 50 Å to about 1500 Å. In an exemplary implementation, silicon layer 130 may be doped. For example, a p-type impurity, such as boron, may be implanted at a dosage of about $2 \times 10^{11}$ atoms/cm$^2$ to about $1 \times 10^{13}$ atoms/cm$^2$ and an implantation energy of about 0.5 KeV to about 10 KeV dope silicon layer 130. Alternatively, other impurities at other dosages may be used to dope silicon layer 130.

In alternative implementations, substrate 10 and layer 130 may comprise other semiconducting materials, such as germanium, or combinations of semiconducting materials, such as silicon-germanium. Buried oxide layer 120 may also include other dielectric materials.

A gate dielectric layer 140 may then be formed on silicon layer 130. Gate dielectric layer 140 may comprise a nitride material, such as Si$_3$N$_4$, or another dielectric material. In an exemplary implementation, gate dielectric layer 140 may have a thickness ranging from about 10 Å to about 50 Å. After forming gate dielectric layer 140, a conductive layer, such as doped polysilicon or amorphous silicon, may be deposited and patterned in a conventional manner to form gate electrode 150. For example, n-typed doped polysilicon or amorphous silicon may be deposited to a thickness ranging from about 600 Å to about 2000 Å. In one embodiment, the thickness of gate electrode 150 may be about 1000 Å.

FIG. 1 illustrates a gate dielectric layer 140 and gate electrode 150 formed over an SOI type substrate. In other implementations consistent with the present invention, gate dielectric layer 140 and gate electrode 150 may be formed on a bulk silicon, germanium or silicon-germanium substrate.

Figure 2:
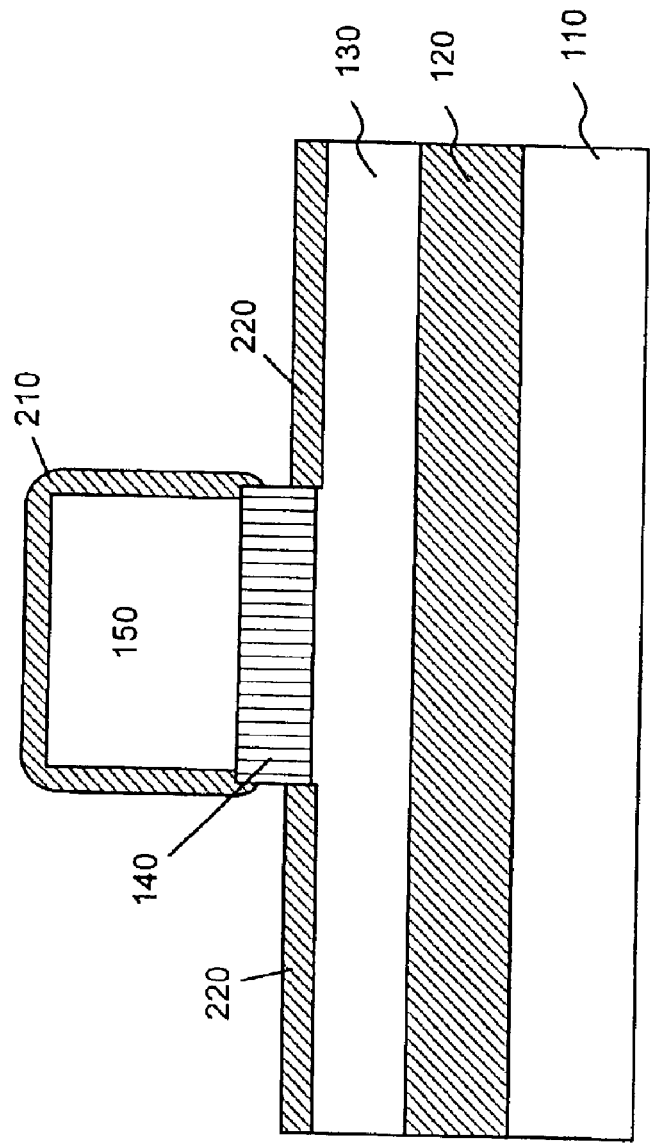

An oxide layer may then be deposited or thermally grown on the exposed surfaces of the gate electrode 150 and silicon layer 130. For example, an oxide layer 210 may be thermally grown on the side surfaces and top surface of gate electrode 150 and an oxide layer 220 may be thermally grown on the upper surface of silicon layer 130, as illustrated in FIG. 2. The oxide layers 210 and 220 may each be grown or deposited to a thickness ranging from about 20 Å to about 25 Å. In some implementations, the thickness of oxide layers 210 and 220 may be controlled. For example, in some implementations, the thickness of oxide layer 210 may be controlled to achieve a thicker oxide layer than the oxide layer 220. This may help to achieve a desired thickness for subsequently formed conductive structures, as described in more detail below.

Figure 3:
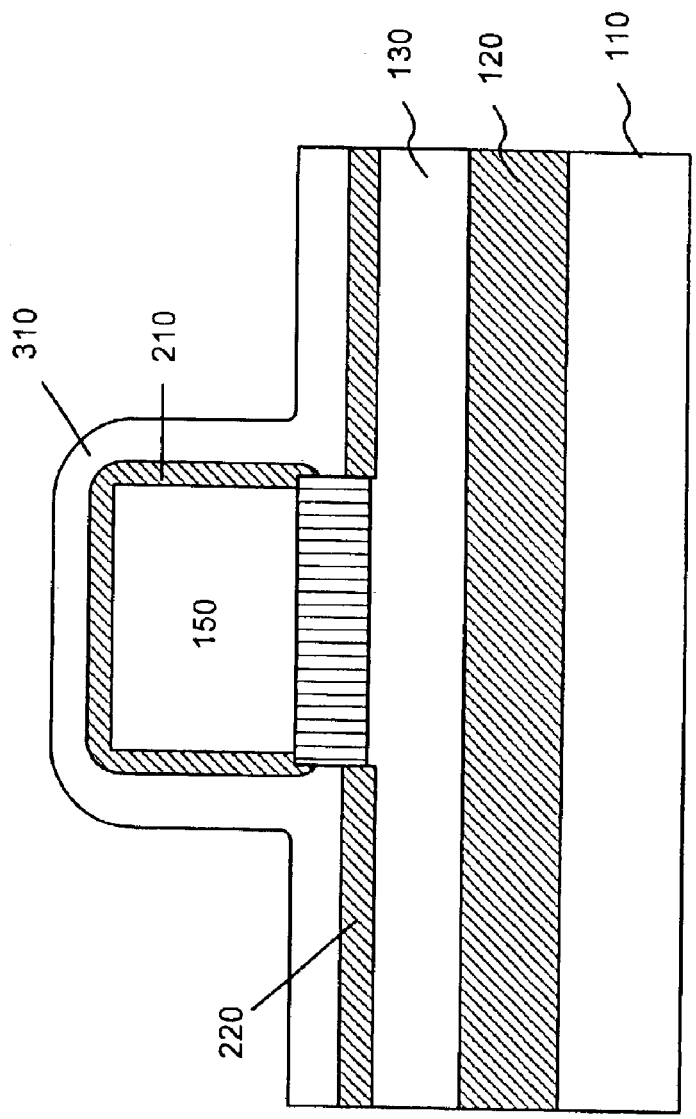

A layer of undoped polysilicon 310 may then be deposited over semiconductor device 100, as illustrated in FIG. 3. In an exemplary implementation, the layer of undoped polysilicon 310 may be conformally deposited via a rapid thermal chemical vapor deposition (CVD) process to a thickness ranging from about 60 Å to about 70 Å.

Figure 4:
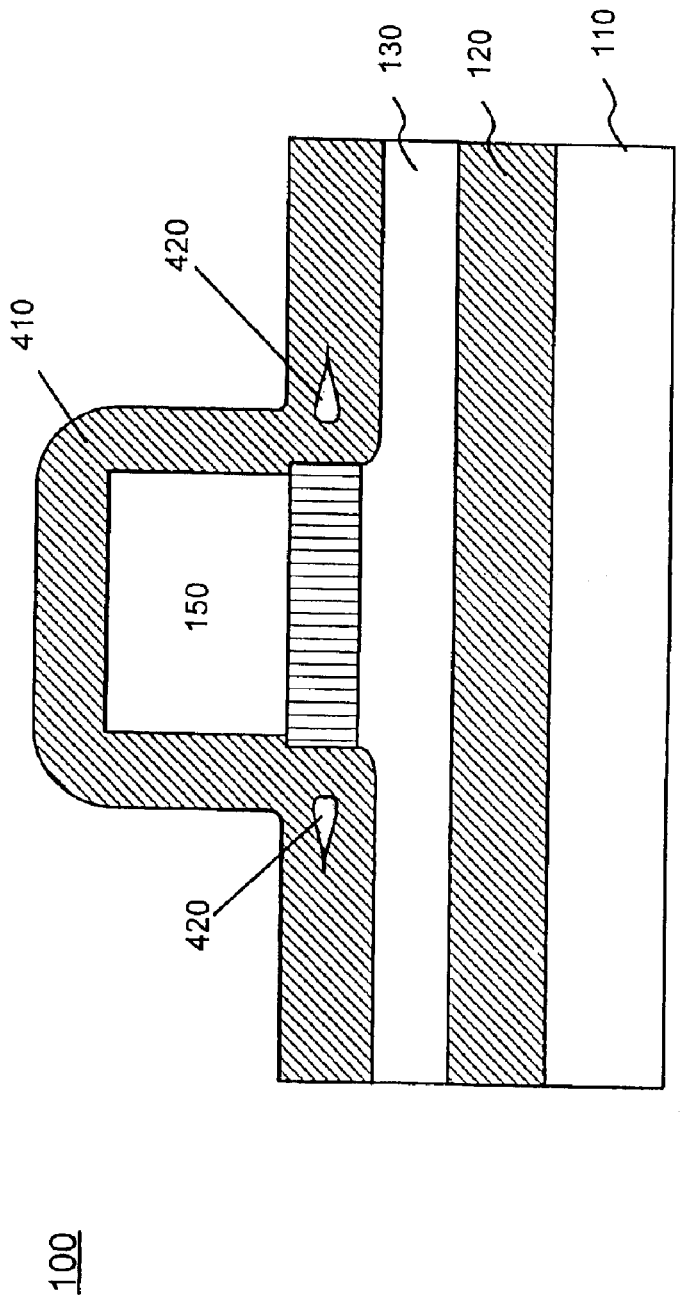

Processes consistent with the present invention may then oxidize polysilicon layer 310 to convert the polysilicon into a silicon oxide. For example, a dry oxidation process may be performed to convert the polysilicon in layer 310 into a layer of silicon oxide 410, as illustrated in FIG. 4. In the example described above in which the polysilicon 310 was deposited to a thickness ranging from about 60 to 70 Å and the oxide layers 210/220 were formed to a thickness ranging from about 20 to 25 Å, the thickness of the layer of polysilicon oxide 410 after the oxidation process may be about 200 Å.

During the oxidation of polysilicon layer 310, portions of the polysilicon layer 310 may not oxidize. For example, polysilicon structures 420, also referred to as polysilicon inserts 420 or polysilicon nanowires 420, may be formed near the bottom corners of the gate electrode 150, as illustrated in FIG. 4. In an exemplary implementation consistent with the present invention, the polysilicon inserts 420 may have a teardrop-like shape and may be very thin. For example, polysilicon inserts 420 may have a cross-sectional size of about 50 Å in length by 20 Å in height.

The polysilicon inserts 420 may essentially form in a continuous strip or ring near the lower corners of gate electrode 150 and running parallel to the side surfaces of gate electrode 150. In alternative implementations, the polysilicon inserts 420 may form in a discontinuous manner as a number of small polysilicon pockets, due to various process variations. In either case, the polysilicon insert 420 may be used as a charge storage element for a memory device or to program a threshold voltage associated with a logic device, as described in more detail below. It has been found that the shape of the polysilicon inserts 420 may create an extremely high electrical field, which accelerates Fowler-Nordheim (F-N) tunneling and may result in faster programming times for the memory device, as described in more detail below. It has also been found that the shape of polysilicon inserts 420 is not very sensitive to the oxidation time of polysilicon layer 410.

Figure 5:
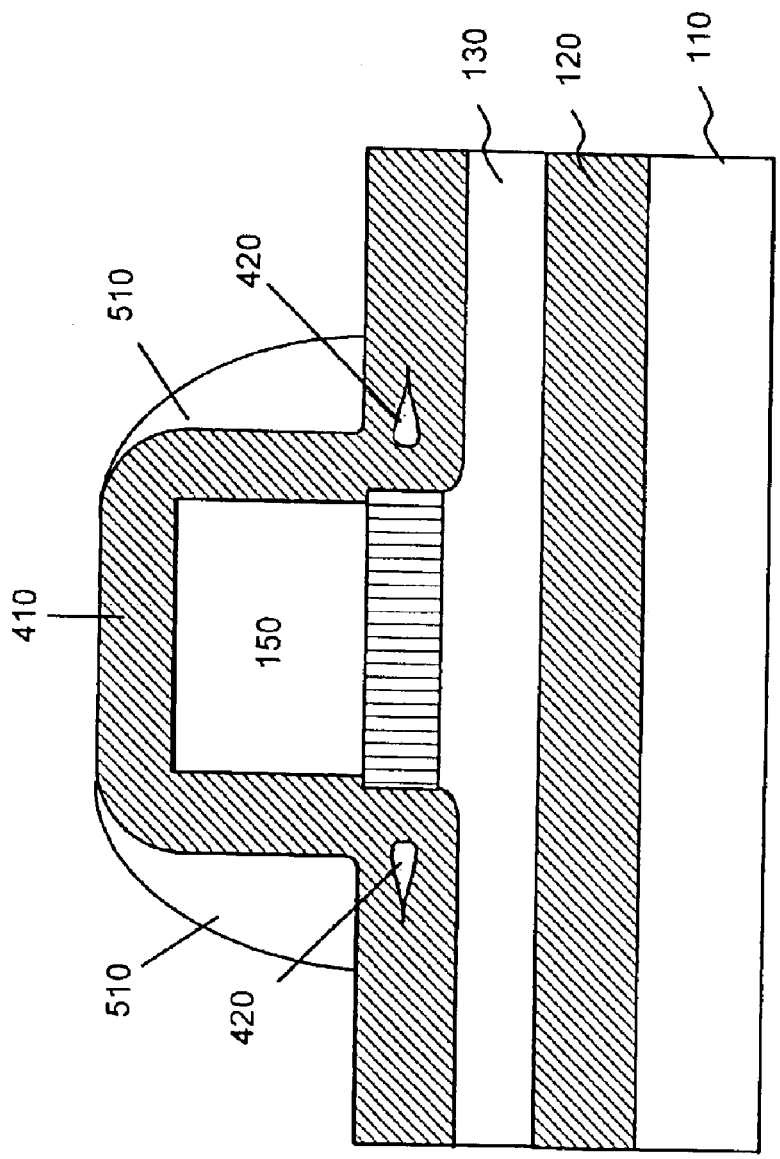

The process may continue by depositing a nitride layer and etching the nitride layer to form nitride sidewall spacers 510, as illustrated in FIG. 5. In alternative implementations, the silicon oxide layer 410 may function as a spacer and the nitride spacers 510 may not be needed. In either case, the process may continue by implanting a dopant in source/drain regions 610 and 620 illustrated in FIG. 6. For example, an n-type dopant, such as arsenic (As), may be implanted to form source/drain implants in source/drain regions 610 and 620. In an exemplary implementation, As may be implanted at a dosage of about $1 \times 10^{14}$ atoms/cm$^2$ to about $2 \times 10^{15}$ atoms/cm$^2$ and an implantation energy of about 4 KeV to about 25 KeV. An activation annealing may then be conducted to activate the implants in the source/drain regions 610 and 620. For example, activation annealing maybe performed at a temperature of about 1025° C. to about 1050° C. for about 20 seconds to about 40 seconds to activate the source/drain implants in source/drain regions 610 and 620. The particular implantation energy and annealing parameters depend on the thickness of layer 130. The implantation and annealing may be targeted to form a junction under the polysilicon inserts 420. If the junction reaches too deep into the channel portion of layer 130 (e.g., past the polysilicon inserts 420), programming may be adversely impacted or may be impossible since stored charges in the polysilicon inserts 420 may not be able to affect the threshold voltage.

Figure 6:
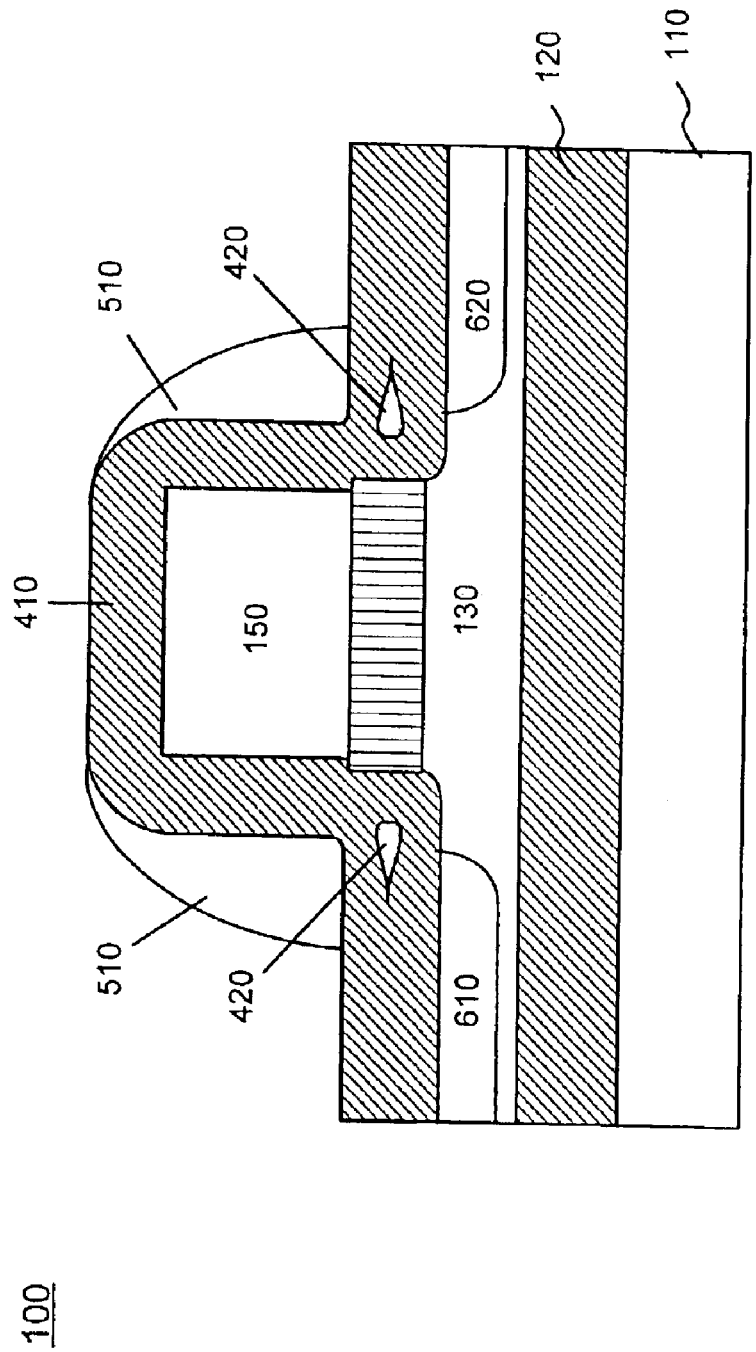

The resulting semiconductor device 100 illustrated in FIG. 6 can operate as a logic transistor device and the polysilicon inserts 420 may be used to program a threshold voltage ($V_t$) for the logic device. For example, by applying a voltage to the drain region 620 ($V_d$), the $V_t$ for semiconductor device 100 may be adjusted. In an exemplary implementation, if a higher $V_t$ is desired, a voltage of about 2–3 volts having a short duration (e.g., about 1 μs, to 1 ms) may be applied to the drain region 620 of semiconductor device 100. Applying the voltage to the drain region 620 acts to trap hot carriers in the polysilicon inserts 420. However, not all of the hot carriers will be trapped in the polysilicon inserts 420. Therefore, semiconductor device 100 may be heated for a relatively short period of time (e.g., about 1–2 hours) at about 150° C. to release trapped charges. In this accelerated manner, semiconductor device 100 may be tested to determine how long charge may be retained in the polysilicon inserts 420.

The $V_t$ of semiconductor device 100 may be set or programmed based on the particular user's requirements by applying a particular $V_d$ having a particular pulse length to drain region 620. In implementations consistent with the present invention, the threshold voltages may be set from a range of about 0.2 volts to 3.0 volts. If semiconductor device 100 is used as a logic transistor device, a relatively low threshold voltage shift (e.g., up to about 0.5 volts) may be needed and may be achieved by biasing the drain 620 and/or source 610 high (e.g., up to about 1.0 volts) and using the highest gate voltage $V_g$ that doesn't impair reliability of the gate dielectric 140 (e.g., up to about 2.5 volts). Hot electrons generated at the drain and/or source junction may be stored in the polysilicon inserts 420, thus modifying the threshold voltage.

If semiconductor device 100 is used as a memory device, as described in more detail below, a lower drain bias $V_d$ (e.g., up to about 100 millivolts) and higher gate biases $V_g$ (e.g., about 2 to 5 volts) may be used, depending on the thickness of the tunnel oxide layer and as described in more detail below. In this case, charges stored in the polysilicon inserts 420 may increase the threshold voltage by about 1 to 2.5 volts.

As discussed above, semiconductor device 100 may also operate as a quantum-well memory device (QWMD) or a flash memory device. For example, polysilicon inserts 420 may function as a floating gate electrode and store charge associated with a non-volatile memory device. The teardrop like shape of polysilicon inserts 420 may create an extremely high electric field, which accelerates F-N tunneling and may result in faster programming times for the memory device.

As discussed above, polysilicon inserts 420 may be formed in a continuous ring-like structure near the lower edge of gate electrode 150 or in a discontinuous manner. In either case, the polysilicon inserts 420 may store charge and function as a floating gate electrode for semiconductor device 100. In addition, if the polysilicon inserts 420 are formed in a discontinuous manner, the performance of the memory device may be improved in some implementations.

Referring to FIG. 6, programming and erasing of device 100 may be performed by applying bias to the gate electrode 150. During programming, electrons may tunnel from the source region 610 and/or drain region 620 into polysilicon inserts 420. If the programming is F-N for thin tunneling barriers or direct quantum mechanical tunneling for thicker barriers, programming may be accomplished by applying a voltage to gate electrode 150 ($V_g$) of about 4 volts to about 12 volts and $V_d$ of about 0.1 volts to drain region 620. During the F-N programming, electrons may tunnel from the n+regions (e.g., source/drain regions 610 and 620) into polysilicon inserts 420 and may also tunnel through the polysilicon inserts 420 into the gate electrode 150. Erasing may be accomplished by applying $V_g$ of about –12 volts to about –4 volts and $V_d$ of about 0.1 volts. During erasing, electrons tunnel from the polysilicon inserts 420 into the source/drain regions 610 and 620. Alternatively, holes may tunnel from the channel into polysilicon inserts 420 and recombine with electrons in the polysilicon inserts 420.

As discussed previously, it has been found that the shape of the polysilicon insert 420 creates an extremely high electric field, which accelerates F-N tunneling. In this manner, semiconductor device 100 may be used as a memory device and the thin polysilicon inserts 420 may function as a floating gate electrode for the memory device. In addition, by controlling the thicknesses of oxide layers 210 and 220, very thin polysilicon inserts 420 may be formed, resulting in faster programming times.

Figure 7:
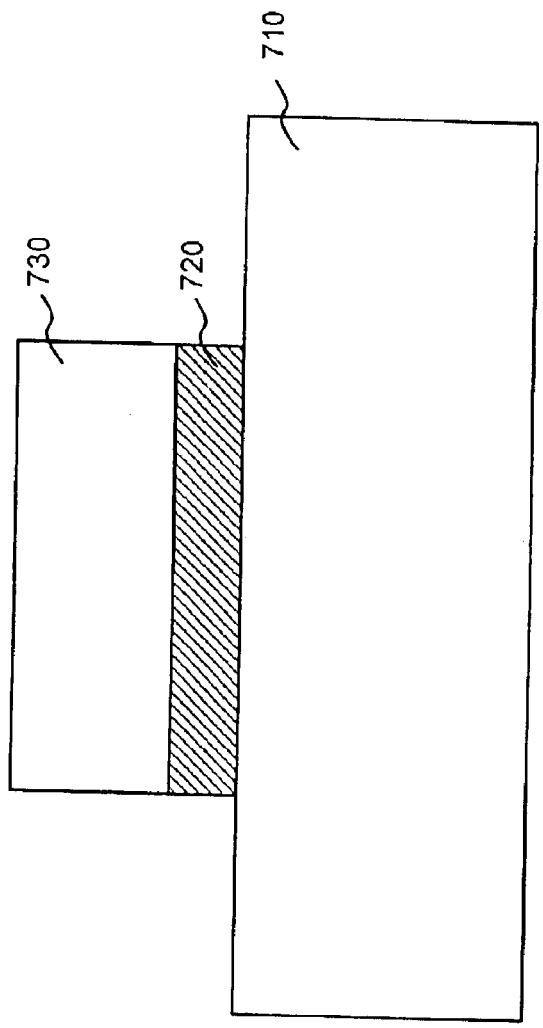
FIGS. 7–12 illustrate the cross-section of a semiconductor device formed in accordance with another exemplary implementation of the present invention.

FIGS. 7–12 illustrates the cross-section of a semiconductor device 700 formed in accordance with another exemplary implementation consistent with the present invention and similar to that disclosed in co-pending U.S. patent application Ser. No. 10/211,317. Referring to FIG. 7, semiconductor device 700 includes a silicon substrate 710. In an exemplary implementation, substrate 710 may comprise doped monocrystalline silicon. For example, a p-type impurity, such as boron, may be implanted at a dosage of about $5 \times 10^{12}$ atomes/cm$^2$ to about $5 \times 10^{13}$ atoms/cm$^2$ and an implantation energy of about 0–20 KeV to dope substrate 710. In alternative implementations, substrate 710 may comprise other semiconducting materials, such as germanium, or combinations of semiconducting materials, such as silicon-germanium.

A gate dielectric layer 720 may then be formed on substrate 710. For example, an oxide (e.g., SiO$_2$) may be thermally grown on substrate 710 to a thickness ranging from about 50 Å to about 150 Å. Gate dielectric layer 720 may form a tunnel layer for a memory device, as described in more detail below.

A conductive layer may then be deposited and patterned in a conventional manner to form gate electrode 730. For example, a polysilicon or amorphous silicon layer doped with, for example, n-type impurities, may be deposited and patterned to form gate electrode 730. In exemplary implementations consistent with the present invention, the thickness of gate electrode 730 may range from about 800 Å to about 2000 Å.

Figure 8:
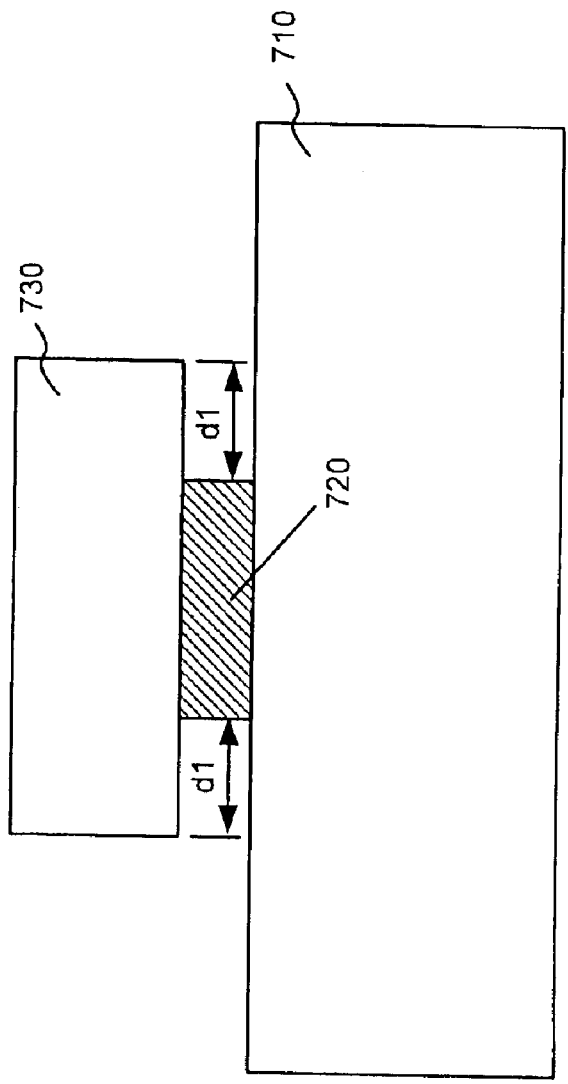
Figure 9:
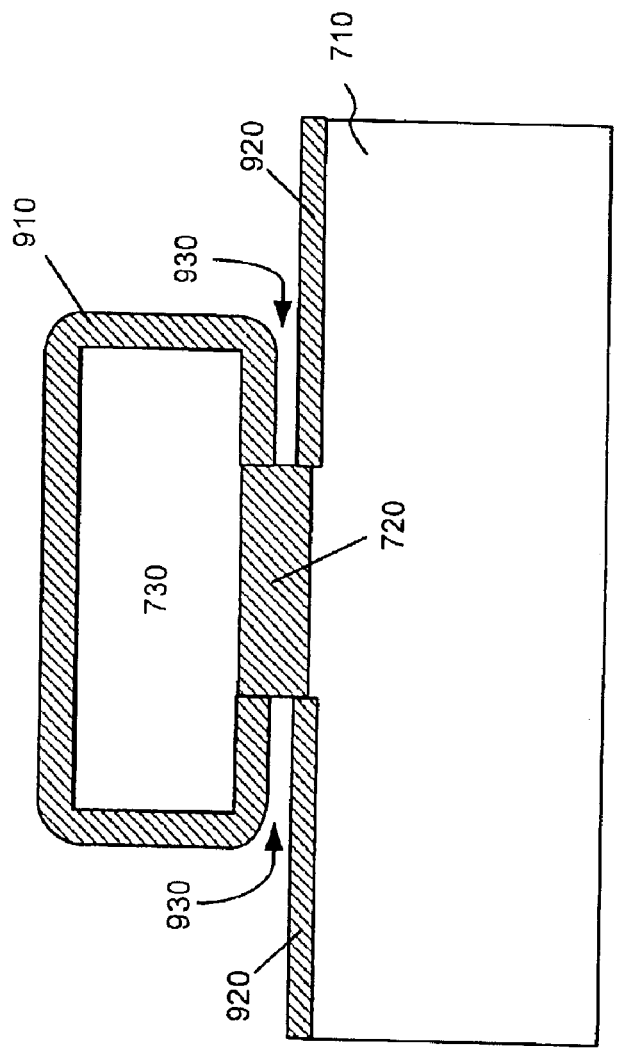

The gate electrode 730 may then be masked and a portion of gate dielectric layer 720 may be removed. For example, semiconductor device 700 may be exposed to diluted hydrofluoric (HF) acid to etch or undercut the gate dielectric layer 720 below the gate electrode 730, as illustrated in FIG. 8. Referring to FIG. 8, the diluted HF may remove a portion of the gate dielectric layer 720 located beneath the gate electrode 730. In an exemplary implementation, the portion of gate dielectric layer 720 remaining after the HF acid etching extends laterally about 15 nanometers (nm) to about 50 nm from each side of gate electrode 730. In other words, the distances labeled dl in FIG. 8, range from about 15 nm to 50 nm. The resulting width of gate dielectric layer 720 may range from about 30 nm to about 100 nm. In exemplary implementations in which the gate dielectric layer 720 is relatively thin (e.g., less than about 70 Å thick), the amount of the gate dielectric layer 720 that may be removed during the HF etching may be essentially self-limiting. For example, for a gate dielectric layer 720 that is about 5 nm in thickness, the undercut may extend 15 nm in the lateral direction (i.e., dl=15 nm), while for a gate dielectric layer 720 that is about 15 nm in thickness, the undercut may extend about 50 nm in the lateral direction (i.e., dl=50 nm). The diluted HF may also remove a small amount of the lower portion of the gate electrode 730. After the HF acid has undercut the gate dielectric layer 720, an oxide layer may be deposited or thermally grown on the exposed surfaces of the gate electrode 730. For example, an oxide layer 910 may be thermally grown on the exposed surfaces of gate electrode 730, as illustrated in FIG. 9. During the oxidation, an oxide layer 920 may also be grown on the upper surface of substrate 710, as illustrated in FIG. 9.

The oxide layers 910/920 may be grown to a thickness ranging from about 15 to 50 Å. Referring to FIG. 9, the oxide layer 920 formed above the surface of silicon substrate 710 may be thinner than the oxide layer 910 formed on the exposed surface of polysilicon gate electrode 730, resulting in a differential oxide thickness. After the oxidation of device 700, a cavity 930 may also be formed below both sides of gate electrode 730, as illustrated in FIG. 9.

Figure 10:
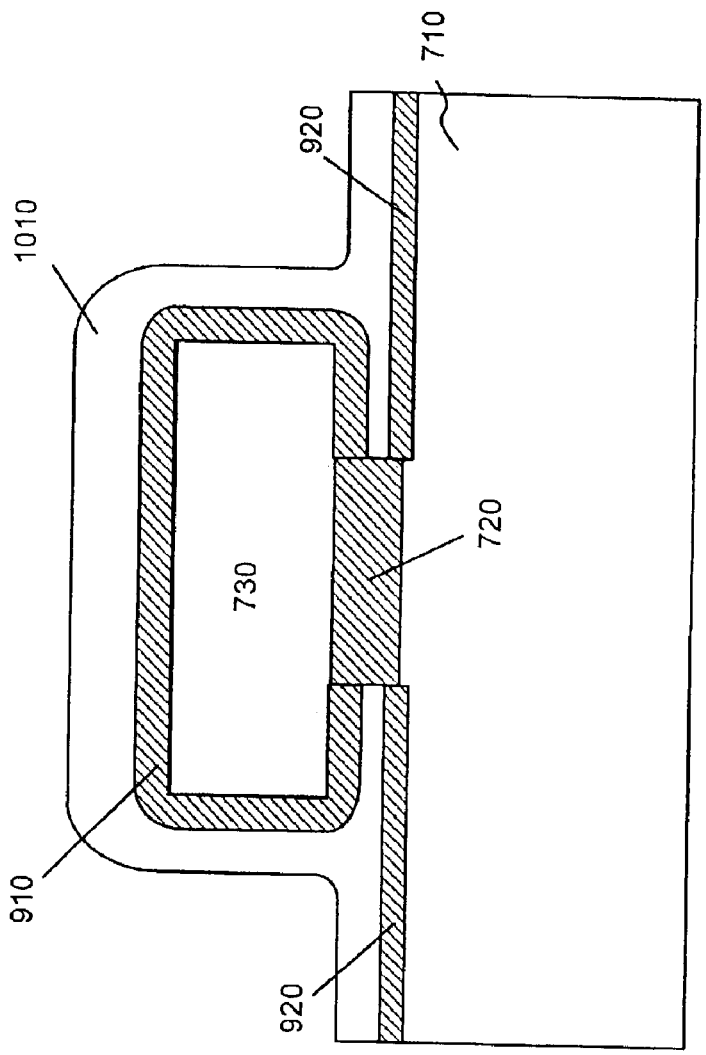

A layer of undoped polysilicon 1010 may then be deposited over semiconductor device 700, as illustrated in FIG. 10. The polysilicon layer 1010 fills the cavities 930 formed below the gate electrode 730. In an exemplary implementation, the layer of undoped polysilicon 1010 may be conformally deposited via a rapid thermal CVD process to a thickness ranging from about 60 Å to about 70 Å to fill cavity 930.

Figure 11:
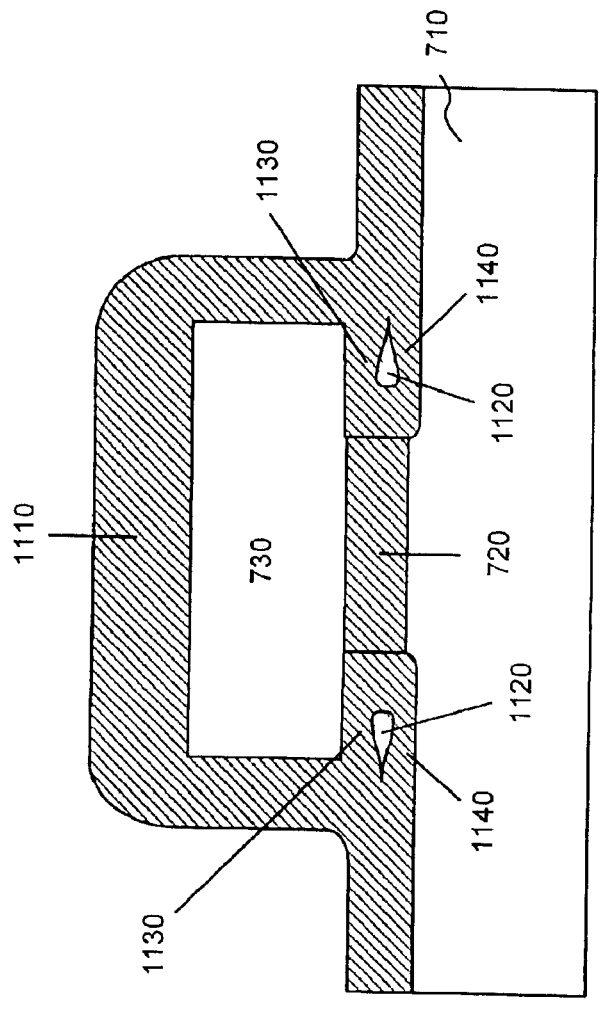

Processes consistent with the present invention may then oxidize polysilicon layer 1010 using, for example, a dry oxidation process, to convert the polysilicon layer 1010 into a layer of silicon oxide 1110, as illustrated in FIG. 11. In the example described above in which the polysilicon layer 1010 was deposited to a thickness ranging from about 60–70 Å and the oxide layers 910 and 920 were formed to a thickness ranging from about 15–50 Å, the layer of polysilicon oxide 1110 after the oxidation process may be about 200 Å in thickness.

During the oxidation of polysilicon layer 1010, portions of the polysilicon layer 1010 may not oxidize. For example, after the oxidation of polysilicon layer 1010 is complete, polysilicon structures 1120, also referred to as polysilicon inserts 1120 or polysilicon nanowires 1120, may remain in the former cavity region 930 below the lower corners of gate electrode 730, as illustrated in FIG. 11. In an exemplary implementation consistent with the present invention, the polysilicon inserts 1120 may have a teardrop-like shape similar to that described above with respect to polysilicon inserts 420. In addition, polysilicon inserts 1120 may be relatively thin slivers of polysilicon. For example, polysilicon inserts, 120 may have a cross-sectional size of about 50 Å in length by 20 Å in height. Oxide areas 1130 may be referred to hereafter as the top oxide or TOX and oxide areas 1140 may be referred to hereafter as the bottom oxide or BOX. In addition, gate dielectric layer 720 may be referred to hereafter as the gate oxide or GOX. The thicknesses of the GOX 720, TOX 1130 and BOX 1140 may be controlled to achieve targeted thicknesses based on the end device requirements, as described in more detail below.

Similar to the discussion above with respect to polysilicon inserts 420, polysilicon inserts 1120 may essentially form in a continuous strip or ring. In semiconductor device 700, however, polysilicon inserts 1120 are located below the lower corners of gate electrode 730 and run parallel to the side surfaces of gate electrode 730 in the former cavity region 930. In alternative implementations, polysilicon inserts 1120 may form in a discontinuous manner due to process variations. In this case, polysilicon inserts 1120 may form a number of small polysilicon pockets. In either case, the polysilicon inserts 1120 may be used to function as a floating gate electrode and store charge in connection with a non-volatile memory device, as described in more detail below. In addition, if the polysilicon inserts 1120 are formed in a discontinuous manner, the performance of the memory device may be improved in some implementations.

The teardrop like shape of the polysilicon insert 1120, as described previously, creates an extremely high electrical field, which accelerates F-N tunneling and may result in faster programming times for the memory device, as described in more detail below. It has also been found that the shape of the polysilicon inserts 1120 are dependent upon the dimensions of cavity 930 (FIG. 9) and are not very sensitive to the oxidation time of polysilicon layer 1010. Therefore, the shape and size of polysilicon inserts 1120 may be optimized based on the particular user's requirements. For example, by forming layer 910 and layer 920 to the desired thicknesses, the resulting dimensions of cavity 930 may be controlled, thereby controlling the size of the polysilicon inserts 1120.

Figure 12:
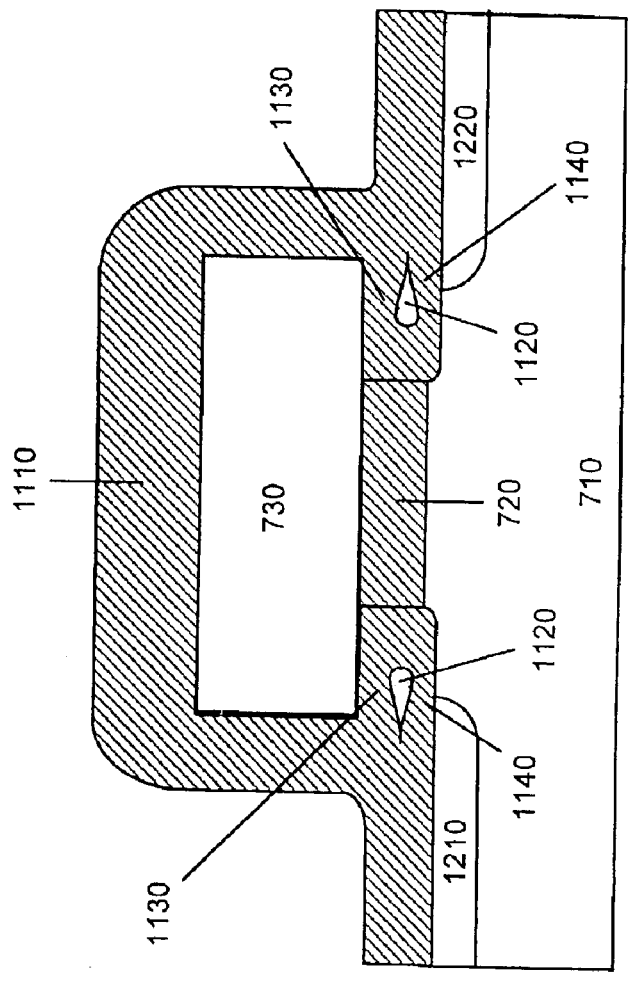

Processing may continue by implanting a dopant in source/drain regions 1210 and 1220 illustrated in FIG. 12. For example, an n-type dopant, such as arsenic (As), may be implanted to form source/drain implants in source/drain regions 1210 and 1220. The junctions for the source/drain implants may be centered below the middle of the polysilicon inserts 1120, as illustrated in FIG. 12. In an exemplary implementation, As may be implanted at a dosage of about $2 \times 10^{15}$ atoms/cm$^2$ to about $4 \times 10^{15}$ atoms/cm$^2$ and an implantation energy of about 15–45 KeV. An activation annealing may then be conducted to activate the implants in source/drain regions 1210 and 1220. For example, activation annealing may be performed at a temperature of about 1025° C. to about 1050° C. for about 20 seconds to about 40 seconds to activate the source/drain implants in source/drain regions 1210 and 1220.

In alternative implementations, a dielectric layer, such as a nitride layer, may be deposited and etched to form sidewall spacers adjacent silicon oxide layer 1110 prior to implanting the impurities in the source/drain regions 1210 and 1220.

The sidewall spacers may be used to optimize the location of the source/drain junctions.

The resulting semiconductor device 700 illustrated in FIG. 12 can operate as a non-volatile memory device. For example, semiconductor device 700 may operate as a QWMD or a flash memory device, depending on the thickness of gate dielectric layer 720, oxide layer 1130 and oxide layer 1140, as described in more detail below.

Programming and erasing of device 700 may be performed by applying bias to the gate electrode 730. During programming, electrons may tunnel from the n+ regions 1210 and 1220 into polysilicon inserts 1120. If the programming is F-N, programming may be accomplished by applying $V_g$ of 6 to 7 volts and $V_d$ of 0 volts. During the F-N programming, electrons may tunnel from the n+ regions 1210 and 1220 into polysilicon inserts 1120 and may also tunnel through the polysilicon inserts 1120 into the gate electrode 730. Erasing may be accomplished by applying $V_g$ of −5 to −6 volts and $V_d$ of 0 volts. During erasing, electrons tunnel from the polysilicon inserts 1120 into the source/drain regions 1210 and 1220. Alternatively, holes may tunnel from the channel into polysilicon inserts 1120 and recombine with electrons in the inserts 1120. As discussed previously, it has been found that the shape of the polysilicon insert 1120 creates an extremely high electric field, which accelerates F-N tunneling.

Figure 13:
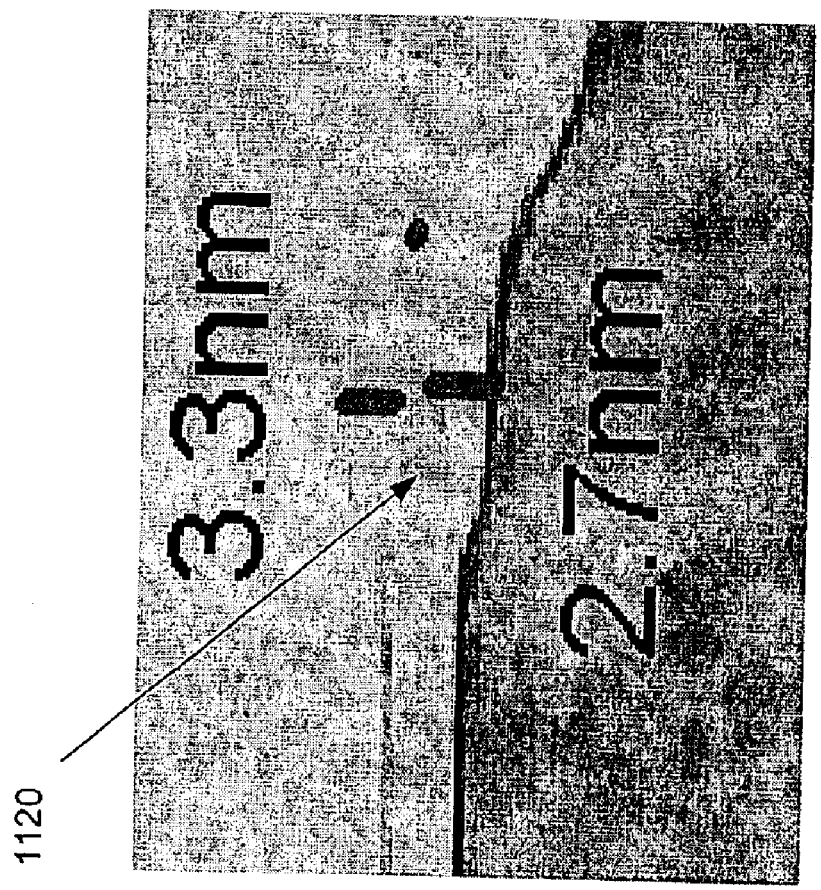
FIG. 13 is a transmission electron micrograph illustrating a polysilicon insert with differential oxides consistent with the present invention.

FIG. 13 illustrates an electron micrograph of a semiconductor device (e.g., semiconductor device 700) formed in accordance with an implementation consistent with the present invention. Referring to FIG. 13, a polysilicon insert 1120 having a teardrop like shape is formed below a gate electrode. In addition, the semiconductor device in FIG. 13 has a differential oxide thickness with respect to polysilicon insert 1120 (bottom oxide of 2.7 nm and top oxide of 3.3 nm). That is, the thickness of the oxide layer between the polysilicon insert 1120 and the corner of the source/drain regions 1210/1220 (e.g., portion 1030 in FIG. 12) is 2.7 nm and the thickness of the oxide layer located between the polysilicon insert 1120 and the gate electrode 730 (e.g., portion 1020) in FIG. 12 is 3.3 nm.

Thicker gate dielectric layers 720 (also referred to as gate oxide 720 or GOX 720) enable deeper cavities 930 to be formed, which may then be filled with thicker polysilicon layers 1010. In this case, the resulting polysilicon inserts 1120 may be larger than if a thinner GOX was used. The thickness of BOX 1140 may be used to determine the programming speed, as well as the endurance and data retention characteristics of semiconductor device 700, as described in more detail below.

As described above, the programming and erasing of semiconductor device 700 may be performed by applying a bias to the gate electrode 730. The operational speed of device 700, consistent with the present invention, has been found to be mainly determined by quantum tunneling (i.e., tunneling to and from polysilicon inserts 1120). Nanoelectronic modeling (NEMO) simulations, consistent with the present invention, have been conducted to examine certain combinations of oxide thicknesses to identify various combinations that result in fast programming times.

Figure 14:
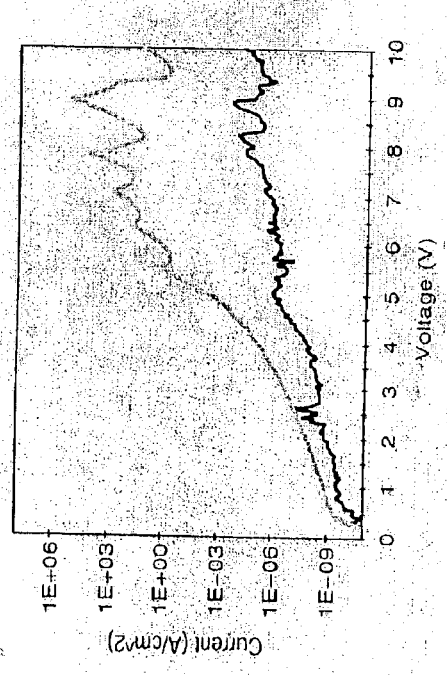
FIG. 14 illustrates nanoelectronic modeling simulations of quantum tunneling currents for an exemplary semiconductor device consistent with the present invention.

Using NEMO simulations, the tunneling currents may be calculated. For example, FIG. 14 illustrates the quantum tunneling currents through a QWMD using NEMO 1-d simulation for a device (e.g., semiconductor device 700) having a 5 nm GOX, 2.7 nm BOX and 3.3 nm TOX. In FIG. 14, a ten volt bias on the control gate electrode 730 corresponds to about 6 volts on polysilicon inserts 1120 due to a coupling ratio of about 0.6. The top curve in FIG. 14 represents the tunneling current into the polysilicon insert 1120 and the bottom curve represents the tunneling current through the polysilicon insert 1120 into the gate electrode 730. From FIG. 14, it can be seen that applying $V_{gs}$ of 7.5 volts or 9 volts will achieve very fast programming since there are about three to four orders of magnitude difference between the two tunneling currents. It can also be seen that for the particular BOX thickness (2.7 nm), at least 6 volts may be applied to the control gate electrode 730 to achieve the desired tunneling. For lower biases, there may be no difference between current flowing into the polysilicon inserts 1120 and current into the control gate 730 and therefore no charge will be stored.

Figure 15:
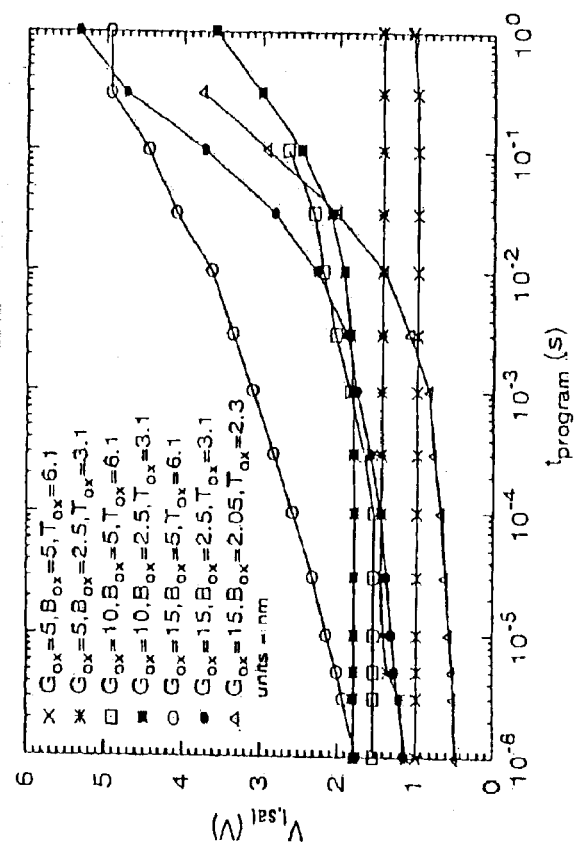
FIG. 15 illustrates hot carrier programming times for various semiconductor devices consistent with the present invention.

Semiconductor device 700 can also be programmed by using conventional hot carrier programming (e.g., drain bias of 3–4 volts and gate bias of 6–12 volts, depending on oxide thicknesses). For example, FIG. 15 illustrates hot carrier programming times for a device with various GOX 720, BOX 1140 and TOX 1130 thicknesses. As illustrated in FIG. 15, a device with a 15 nm GOX and 5 nm BOX may be programmed in a manner similar to a conventional flash memory. On the other hand, devices consistent with the present invention with very thin BOX and TOX may not be programmed in that manner since gate voltages may be too low for significant differential tunneling currents, while F-N electrons tunnel into the gate electrode 730.

Hot carrier programming may not be desirable in some cases because it may trap charge in the oxide layer, such as a device with a 15 nm GOX and 5 nm BOX, as illustrated in FIG. 16. Even after erasing, the subthreshold slope may still degrade, although to a lesser extent because those states relax more quickly.

FIG. 17 illustrates tunneling current programming for a QWMD device with a 5 nm GOX and 5 nm BOX, which has extremely thin polysilicon inserts 1120. As illustrated in FIG. 17, the subthreshold slope (about 86 mV/dec) does not change after programming ($V_{gs}$=6 and 7V, $V_{ds}$=1V) and erasing ($V_{gs}$=−6V). The QWMD device is thin in two dimensions and may be considered to be a quantum-dot floating gate memory device. However, its third dimension may be larger to achieve high read currents. Between 200 and 1000 electrons may be stored depending on the size of the polysilicon inserts 1120 that form the floating ring around semiconductor device 700.

FIG. 18 illustrates programming and erasing times ($t_{prog}$ and $t_{erase}$) for various QWMD devices consistent with the present invention under various programming and erase conditions, assuming a threshold voltage shift of one volt. From FIG. 18, it can be seen that tunneling programming speed depends on the thickness of polysilicon insert 1120. For the thinnest BOX and TOX illustrated in FIG. 18, (1.62 nm and 1.8 nm respectively), programming time is 11 $\mu$s for a thicker GOX (15 nm), which has a thicker polysilicon insert 1120, while programming time is 70 ns in the case of thinner GOX (10 nm), which has thinner polysilicon inserts 1120.

Figure 19:
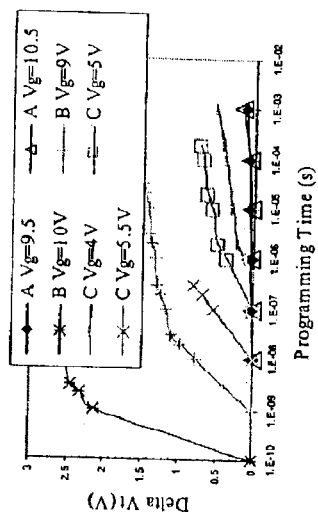
FIG. 19 illustrates programming times for exemplary semiconductor devices consistent with the present invention.

FIG. 19 illustrates programming times for three different wafers using a programming voltage that is close to the breakdown voltage of the BOX. Device A in FIG. 19 represent a device with a 10 nm GOX, 2.7 nm BOX, device B represents a device with a 5 nm GOX and a 5 nm BOX and device C represents a device with a 5 nm GOX and 1.62 nm BOX. Referring to FIG. 19, it can be seen that a thin BOX (device C) enables fast programming (e.g., about 100 ns). However, a thicker BOX (e.g., about 5 nm; device B), which has extremely thin polysilicon inserts 1120, is faster. The programming times for the latter device may be in the sub-ns range. On the other hand, the wafer with the thick polysilicon inserts (device A) results in slow programming speeds.

Figure 20:
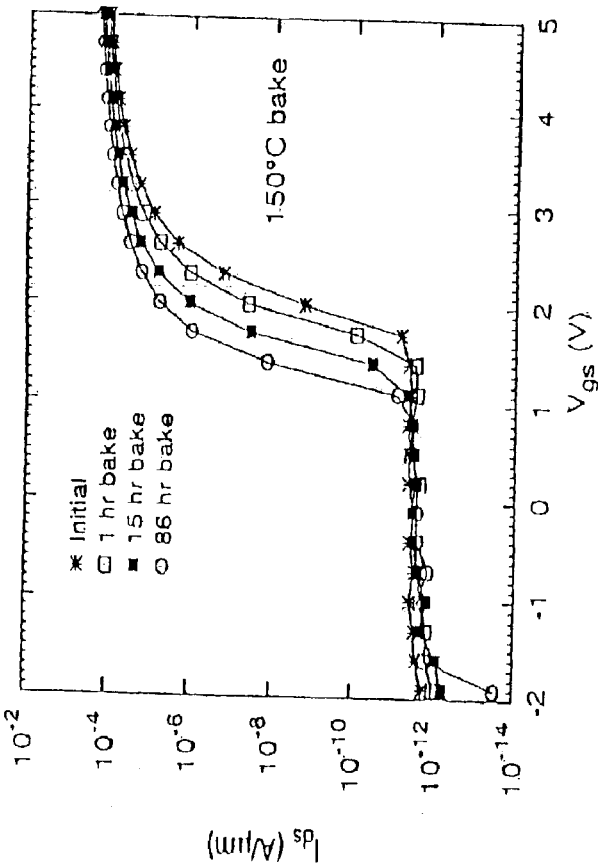
FIG. 20 illustrates subthreshold slope of an exemplary semiconductor device consistent with the present invention during a baking process.

Data retention for memory devices consistent with the present invention have also been tested under elevated temperature (e.g., 150° C.). FIG. 20 illustrates data retention for a QWMD device with a 5 nm GOX and a 2.7 nm BOX that was programmed using tunneling at $V_{gs}$=7V. As illustrated in FIG. 20, the subthreshold slope does not degrade during the 150° C. bake.

Figure 21:
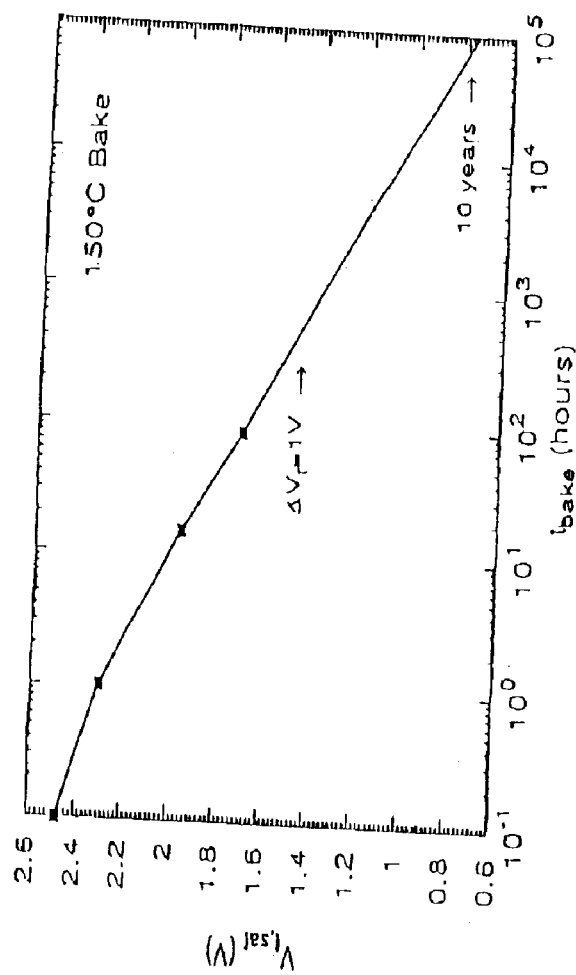
FIG. 21 illustrates a data retention curve for an exemplary semiconductor device consistent with the present invention.

FIG. 21 illustrates a data retention curve for a QWMD device with a targeted $\Delta V_t$ of 1V (i.e., threshold voltage shift of 1 volt to enable multibit memory applications). Referring to FIG. 21, the data retention curve shows that at high operational temperature (150° C.), a threshold voltage shift occurs after 600 hours. Even after ten years, the extrapolated threshold voltage shift is only about 1.7V, which is well within commercially practical ranges.

Figure 22:
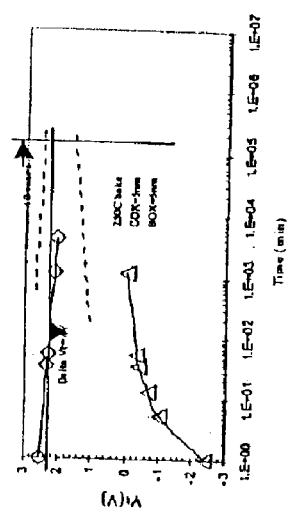
FIG. 22 illustrates a data retention curve for another exemplary semiconductor device consistent with the present invention.

FIG. 22 illustrates data retention for a device having a 5 nm GOX, a 5 nm BOX and a 6.1 nm TOX measured at 250° C. Even at such an elevated temperature, a threshold voltage shift of 1 volt does not occur in 10 years. Device endurance is also important. While FIG. 22 shows that the semiconductor device (e.g., semiconductor device 700) can achieve excellent data retention and can be programmed very quickly, program/erase cycling may degrade the data retention.

Figure 23:
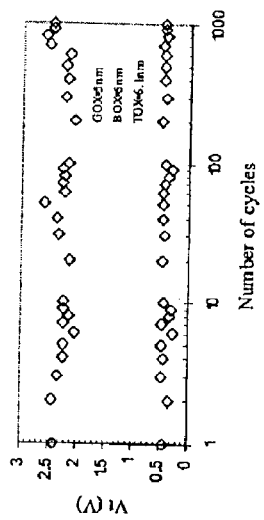
FIGS. 23 and 24 illustrate endurance for exemplary semiconductor devices consistent with the present invention.
Figure 24:
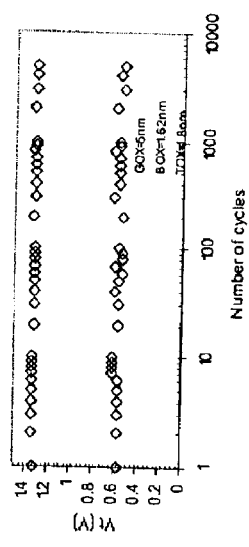
Figure 25:
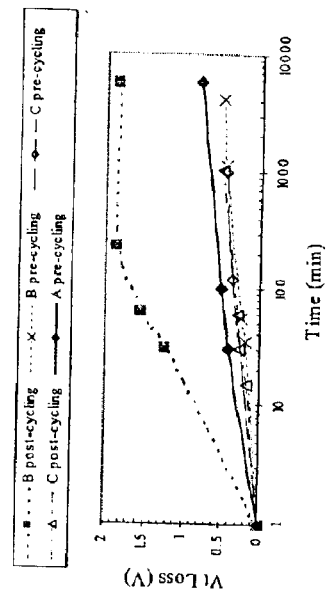
FIG. 25 illustrates data retention before and after cycling for exemplary semiconductor devices consistent with the present invention.

For example, FIG. 23 illustrates the threshold voltage versus the number of programming/erase cycles for a GOX of 5 nm, a BOX of 5 nm and a TOX of 6.1 nm and FIG. 24 illustrates the threshold voltage versus the number of programming/erase cycles for a GOX of 5 nm, a BOX of 1.62 nm and a TOX of 1.8 nm. As illustrated, program cycling may take a heavy toll on the 5 nm BOX. After 2000 cycles, the threshold voltage drops 1 volt in 20 minutes at 250° C. FIG. 25 illustrates before and after data cycling for three devices. Device A has a 10 nm GOX and a 2.7 nm BOX measured at 250° C., device B has a 5 nm GOX and a 5 nm BOX also measured at 250° C. and device C has a 5 nm GOX and a 1.62 nm BOX measured at room temperature. As illustrated, the very thin BOX device has the same data retention regardless of the cycling.

In summary, the non-volatile memory device described above can be scaled well below a 50 nm gate length, while achieving excellent charge retention at room temperature. The device formation includes two processes that may be self-limiting: the gate oxide 720 undercut (illustrated and described with respect to FIG. 8) and the oxidation of the polysilicon 1010 (illustrated and described with respect to FIG. 11). These self-limiting processes enable better manufacturability sensitivity. In addition, very fast operation can be achieved by using thin oxide layers to create small cavities 930, resulting in a very thin polysilicon inserts 1120. The ten-year data retention times for such devices can be achieved even for very thin oxides (e.g., 2.7 nm). Further optimizations may also be achieved with drain junction engineering.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) processes can be employed.

In practicing the present invention, conventional photolithographic and etching techniques are employed, and hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

For example, the present invention has been described with respect to forming thin inserts comprising polysilicon. In other implementations, the thin inserts or nanowires formed may comprise other conductive materials, such as germanium, silicon-germanium, other semiconducting materials or various metals.

In addition, no element, act or instruction used in the description of the present invention should be construed as critical or essential to the invention unless explicitly described as such. Also, as used herein, the article "a" is intended to include one or more items. Where only one item is intended, the term "one" or similar language is used

What is claimed is:

1. A semiconductor device, comprising:
   a semiconductor substrate comprising a channel region, a source region and a drain region;
   a gate electrode having an upper surface and side surfaces;
   a dielectric layer formed adjacent the side surfaces of the gate electrode and extending over the source region and drain region; and
   at least one silicon structure formed within a portion of the dielectric layer and located near a lower portion of the gate electrode, wherein the at least one silicon structure functions to change a threshold voltage of the semiconductor device based on a voltage applied to the drain region.

2. The semiconductor device of claim 1, wherein the at least one silicon structure comprises first and second structures, the first structure extending below a first one of the side surfaces of the gate electrode and the second structure extending below a second one of the side surfaces of the gate electrode.

3. The semiconductor device of claim 2, wherein the first silicon structure is capacitively coupled to the gate electrode and the drain region.

4. A semiconductor device comprising:
   a semiconductor substrate comprising a channel region, a source region and a drain region;
   a gate electrode having an upper surface and side surfaces;
   a dielectric layer formed adjacent the side surfaces of the gate electrode and extending over the source region and drain region; and
   at least one silicon structure formed within a portion of the dielectric layer and located near a lower portion of the gate electrode, wherein the at least one silicon structure comprises first and second structures each having a tear drop-like cross-sectional shape, the first structure being disposed near a lower portion of a first one of the side surfaces of the gate electrode and the second structure being disposed near a lower portion of a second one of the side surfaces of the gate electrode.

5. The semiconductor device of claim 1, wherein the at least one silicon structure comprises at least one of a continuous polysilicon structure or a number of discontinuous pockets of polysilicon.

6. The semiconductor device of claim 1, wherein the semiconductor substrate comprises a first silicon layer formed on an oxide layer formed on a second silicon layer.

7. A non-volatile memory device, comprising:

a semiconductor substrate comprising a channel region, a source region and a drain region;

a control gate electrode having an upper surface and side surfaces;

a dielectric layer formed on an upper surface of the semiconductor substrate and adjacent the side surfaces of the control gate electrode; and at least one silicon structure formed within the dielectric layer near a lower portion of the control gate electrode, the at least one silicon structure functioning as a charge storage structure for the non-volatile memory device, wherein the at least one silicon structure has a teardrop-like cross-sectional shape and forms a ring-like structure near the lower portion of the control gate electrode.

8. The non-volatile memory device of claim 7, wherein the at least one silicon structure comprises a number of polysilicon structures formed in at least one of a continuous or discontinuous manner near each side surface of the control gate electrode.

9. The non-volatile memory device of claim 7, wherein the dielectric layer comprises an oxide layer and a thickness of a portion of the oxide layer located between the substrate and the at least one silicon structure is less than a thickness of the oxide layer located between the at least one silicon structure and the control gate electrode.

10. The non-volatile memory device of claim 7, wherein the at least one silicon structure has a cross-sectional size of about 50 Å in length and about 20 Å in height.

11. A semiconductor device, comprising:

a semiconductor substrate;

a source region and a drain region;

a gate electrode having an upper surface and side surfaces;

a dielectric formed adjacent the side surfaces of the gate electrode and above the semiconductor substrate; and at least one silicon structure formed within a portion of the dielectric, the at least one silicon structure being located near a lower portion of the gate electrode, and wherein the at least one silicon structure enables a threshold voltage of the semiconductor device to be changed based on a voltage applied to the drain region.

12. The semiconductor device of claim 11, wherein the at least one silicon structure is not located directly below the gate electrode.

13. The semiconductor device of claim 11, wherein the semiconductor device comprises a logic device.

14. The semiconductor device of claim 11, wherein the substrate comprises a first semiconducting material formed on an oxide layer formed on a second semiconducting material.

* * * * *